United States Patent

Mezzacapo et al.

(10) Patent No.: US 11,687,814 B2
(45) Date of Patent: Jun. 27, 2023

(54) THRESHOLDING OF QUBIT PHASE REGISTERS FOR QUANTUM RECOMMENDATION SYSTEMS

(71) Applicant: International Business Machines Corporation, Armonk, NY (US)

(72) Inventors: Antonio Mezzacapo, Westchester, NY (US); Jennifer Ranae Glick, White Plains, NY (US)

(73) Assignee: INTERNATTONAL BUSINESS MACHINES CORPORATION, Armonk, NY (US)

( * ) Notice: Subject to any disclaimer, the term of this patent is extended or adjusted under 35 U.S.C. 154(b) by 1223 days.

(21) Appl. No.: 16/229,074

(22) Filed: Dec. 21, 2018

(65) Prior Publication Data

US 2020/0202248 A1    Jun. 25, 2020

(51) Int. Cl.
*G06N 10/00* (2022.01)
*H03H 7/18* (2006.01)
*G06F 17/10* (2006.01)
*B82Y 10/00* (2011.01)

(52) U.S. Cl.
CPC ............ *G06N 10/00* (2019.01); *G06F 17/10* (2013.01); *H03H 7/18* (2013.01); *B82Y 10/00* (2013.01)

(58) Field of Classification Search
CPC .......... G06N 10/00; G06F 17/10; H03H 7/18; B82Y 10/00
See application file for complete search history.

(56) References Cited

U.S. PATENT DOCUMENTS

| 6,760,136 | B2 | 7/2004 | Azuma |
| 9,275,011 | B2 | 3/2016 | Svore et al. |
| 11,079,790 | B2 * | 8/2021 | Fernandes Ramos ........... H03L 7/0995 |
| 2017/0194930 | A1 | 7/2017 | Wiebe et al. |
| 2017/0357907 | A1 | 12/2017 | Krovi |
| 2018/0232652 | A1 | 8/2018 | Curtis et al. |

(Continued)

FOREIGN PATENT DOCUMENTS

WO    2017116446 A1    7/2017

OTHER PUBLICATIONS

Duan, Bojia, et al. "Efficient quantum circuit for singular-value thresholding." Physical Review A 98, 012308 (2018). 10 pages.

(Continued)

*Primary Examiner* — Kenneth B Wells
(74) *Attorney, Agent, or Firm* — Amin, Turocy & Watson, LLP

(57) ABSTRACT

Techniques regarding a threshold scheme for quantum recommendation algorithms are provided. For example, one or more embodiments described herein can comprise a system, which can comprise a memory that can store computer executable components. The system can also comprise a processor, operably coupled to the memory, and that can execute the computer executable components stored in the memory. The computer executable components can comprise a quantum recommendation component that can project a preference vector onto a portion of a Hilbert space based on a value of a qubit phase register. The portion of the Hilbert space can encode singular values of a preference matrix that are greater than or equal to a defined threshold.

15 Claims, 12 Drawing Sheets

(56) References Cited

U.S. PATENT DOCUMENTS

2018/0276555 A1 9/2018 Weichenberger
2020/0279185 A1* 9/2020 Wiebe .................... G06F 17/18

OTHER PUBLICATIONS

Kerenidis, Iordanis, et al. "Quantum Recommendation Systems." arXiv preprint arXiv:1603.08675. Sep. 22, 2016. 22 pages.
Barenco, Adriano, et al. "Elementary gates for quantum computation." Physical Review A 52, 3457. Mar. 23, 1995. arXiv:quant-ph/9503016. 31 pages.
Mell, Peter, et al. "The NIST Definition of Cloud Computing." National Institute of Standards and Technology. Sep. 2011. 7 pages.

* cited by examiner

| $\theta^+/2\pi$ | $\sigma^+/\|A\| = \cos(\theta^+/2)$ | $\theta^-/2\pi$ | $\sigma^-/\|A\| = \cos(\theta^-/2)$ |
|---|---|---|---|
| .0000₂ | - | - | - |
| .0001₂ | 0.981 | .1110₂ | 0.924 |
| .0011₂ | 0.831 | .1100₂ | 0.707 |
| .0111₂ | 0.195 | .1000₂ | 0.000 |
| .1111₂ | - | - | - |

THRESHOLDING OF QUBIT PHASE REGISTERS FOR QUANTUM RECOMMENDATION SYSTEMS

BACKGROUND

The subject disclosure relates to quantum recommendation systems, and more specifically, a thresholding scheme for a quantum projection based on a value of a qubit phase register.

Recommendation systems are ubiquitous in the retail industry. A recommendation system aims to predict the preferences of a given user among a set of products and/or services offered by a provider. To facilitate the predictions, the system utilizes information about the preferences of other users, which is stored in a database.

Typical classical recommendation system can implement algorithms that compute a singular value decomposition ("SVD") of a preference matrix, which encodes the information comprised within the database of user preferences. The classical recommendation systems can then compute a projection of a user vector, which encodes the preferences of the subject user, onto a Hilbert space spanned by a subset of singular vectors corresponding to the highest singular values of the SVD of the preference matrix.

The efficiency of recommendation systems can be improved using quantum computing devices, which can implement a quantum algorithm. The quantum algorithm can perform on a quantum singular value estimation routine, which can entangle a product-user quantum register that encodes properties of the preference matrix, with a qubit phase register. To perform projection of the user vector onto the highest singular vectors of the preference matrix, the quantum algorithm can project the qubit phase register onto a part of the Hilbert space encoding the highest singular values that are above a defined threshold. However, conventional quantum recommendation algorithms determine the threshold through one or more arithmetic calculations, which can be time consuming and/or resource demanding.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatuses and/or computer program products that can facilitate implementing a thresholding scheme for one or more quantum recommendation algorithms are described.

According to an embodiment, a system is provided. The system can comprise a memory that can store computer executable components. The system can also comprise a processor, operably coupled to the memory, and that can execute the computer executable components stored in the memory. The computer executable components can comprise a quantum recommendation component that can project a preference vector onto a portion of a Hilbert space based on a value of a qubit phase register. The portion of the Hilbert space can encode singular values of a preference matrix that are greater than or equal to a defined threshold. An advantage of such a system can be the enablement of a user of the system to define an arbitrary threshold to control the operation of a quantum recommendation algorithm.

In some examples, the system can also comprise a binarization component that can compute a plurality of binarized phase values based on the defined threshold and the preference matrix. Further, the system can comprise an initialization component that can determine a number of threshold qubits comprised within a threshold register based on an amount of significant digits in the plurality of binarized phase values and an amount of qubits comprised within the qubit phase register. The threshold qubits can be entangled with the quantum states of the qubit phase register to identify the portion of the Hilbert space. An advantage of such a system can be the establishment of linear overhead in time and/or memory resources during execution of a quantum recommendation algorithm, thereby translating to a short-depth quantum circuit that can save computation times on quantum processors with finite coherence times.

According to an embodiment, a computer-implemented method is provided. The computer-implemented method can comprise projecting, by a system operatively coupled to a processor, a preference vector onto a portion of a Hilbert space based on a value of a qubit phase register. The portion of the Hilbert space can encode singular values of a preference matrix that are greater than or equal to a defined threshold. An advantage of such a computer-implemented method can be the implementation of a thresholding scheme to increase the efficiency of quantum recommendation algorithms for recommendation systems.

In some examples, computer-implemented method can comprise computing, by the system, a plurality of binarized phase values based on the defined threshold and the preference matrix. The computer-implemented method can also comprise determining, by the system, a number of threshold qubits comprised within a threshold register based on an amount of significant digits in the plurality of binarized phase values and an amount of qubits comprised within the qubit phase register. Further, the computer-implemented method can comprise entangling, by the system, a first threshold qubit from the threshold qubits to quantum states of the qubit phase register that correspond to a first phase region of the Hilbert space that is less than a first binarized phase value from the plurality of binarized phase values. An advantage of such a computer-implemented method can be the identification of phase regions within a Hilbert space that meet threshold criteria based on the quantum states of a qubit phase register rather than conventional mathematical techniques.

According to an embodiment, a computer program product for implementing a thresholding scheme for a qubit phase register is provided. The computer program product can comprise a computer readable storage medium having program instructions embodied therewith. Also, the program instructions can be executable by a processor to cause the processor to project, by a system operatively coupled to the processor, a preference vector onto a portion of a Hilbert space based on a value of a qubit phase register. The portion of the Hilbert space can encode singular values of a preference matrix that are greater than or equal to a defined threshold. An advantage of such a computer program product can be the thresholding a qubit phase register in the context of a quantum recommendation algorithm, thereby enabling efficient execution of the latter in quantum computing architectures (e.g., such as superconducting qubit processors).

In some examples, the program instructions can further cause the processor to compute, by the system, a plurality of binarized phase values based on the defined threshold and the preference matrix. Also, the program instructions can cause the processor to determine, by the system, a number of threshold qubits comprised within a threshold register based on an amount of significant digits in the plurality of binarized phase values and an amount of qubits comprised within the qubit phase register. An advantage of such a computer program product can be the initialization of a threshold register that can facilitate a thresholding procedure with less computation resources than required by conventional quantum recommendation algorithms.

According to an embodiment, a system is provided. The system can comprise memory that can store computer executable components. The system can also comprise a processor, operably coupled to the memory, and that can execute the computer executable components stored in the memory. The computer executable components can comprise a quantum recommendation component that can implement a quantum recommendation algorithm using a thresholding scheme that projects a preference vector onto a portion of a Hilbert space based on quantum states of a qubit phase register and a defined threshold. An advantage of such a system can be use of quantum entanglement to execute a thresholding scheme to reduce the consumption of computational resources.

In some examples, the system can also comprise a binarization component that can compute a plurality of binarized phase values from the defined threshold. The plurality of binarized phase values can define a plurality of phase regions of the Hilbert space upon which to project the preference vector. An advantage of such a system can be that a user of the system can execute a quantum recommendation algorithm using an arbitrary threshold that can delineate desired levels of precision controlled by the number of qubits in the qubit phase register.

According to an embodiment, a computer program product for implementing a thresholding scheme for a qubit phase register is provided. The computer program product can comprise a computer readable storage medium having program instructions embodied therewith. The program instructions can cause the processor to execute, by a system operatively coupled to the processor, a quantum recommendation algorithm using the thresholding scheme, which can project a preference vector onto a portion of a Hilbert space based on quantum states of the qubit phase register and a defined threshold. An advantage of such a computer program product can be the autonomous execution of a quantum recommendation algorithm based on a user defined threshold.

In some examples, the program instructions can further cause the processor to compute, by the system, a plurality of binarized phase values from the defined threshold. The plurality of binarized phase values can define a plurality of phase regions of the Hilbert space upon which to project the preference vector. Also, the program instructions can cause the processor to entangle, by the system, a plurality of threshold qubits of a qubit threshold register with the quantum states of the qubit phase register based the plurality of binarized phase values. An advantage of such a computer program product can be execution of a quantum recommendation algorithm that can utilize a threshold scheme based on quantum states of the qubit phase register rather than mathematical computation to reduce the amount of required computational resources.

DETAILED DESCRIPTION

Figure 1:
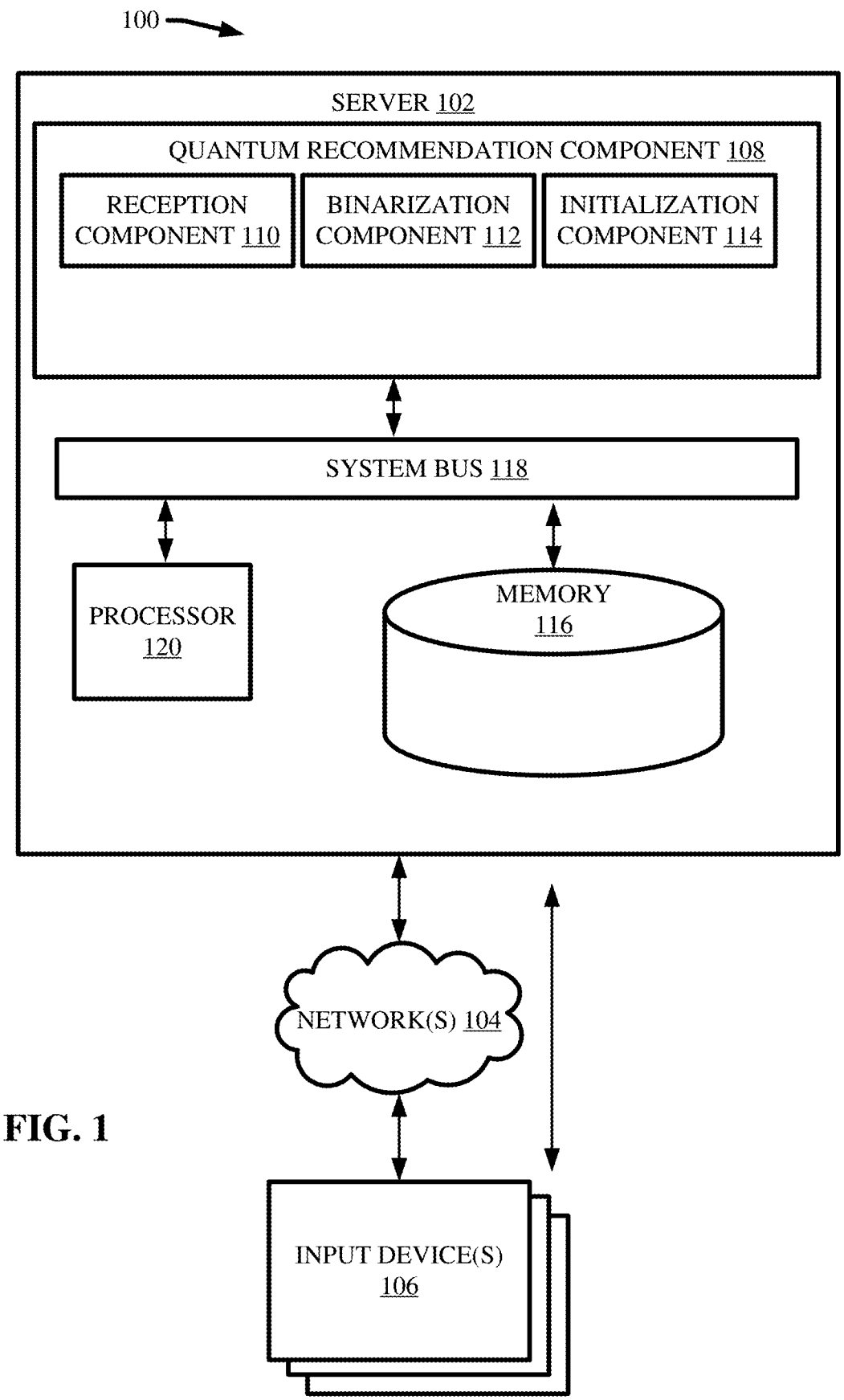
FIG. 1 illustrates a block diagram of an example, non-limiting system that can implement a thresholding scheme for a quantum recommendation algorithm based on one or more quantum states of a qubit phase register in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Given the problems with conventional implementations of quantum recommendations algorithms; the present disclosure can be implemented to produce a solution to one or more of these problems in the form of a thresholding scheme that can perform a projection of user's preference vector onto a Hilbert space via thresholding of a qubit phase register to a threshold value set by the user of a quantum recommendation algorithm using an additional qubit thresholding register and/or work register. The size of the thresholding register and/or work register can be dependent on the given threshold and/or can grow at worst linearly with the number of qubits comprised within the qubit phase register. Advantageously, quantum recommendation algorithms can perform at an exponentially faster rate than conventional SVD-based classical algorithms for recommendation systems. Additionally, thresholding a qubit phase register in the context of a quantum recommendation algorithm can allow for the efficient execution of the latter in quantum computing architectures, such as superconducting qubit processors. Further, the linear overhead in time and/or memory of the various embodiments described herein can translate into a short-depth quantum circuit, thereby saving computation runtimes on quantum processors with finite coherence times. Moreover, the one or more thresholding schemes described herein can enable a user to input an arbitrary threshold, with desired levels of precision controlled by the number of qubits in the qubit phase register.

Various embodiments of the present invention can be directed to computer processing systems, computer-implemented methods, apparatus and/or computer program products that facilitate the efficient, effective, and autonomous (e.g., without direct human guidance) thresholding of a qubit phase register with regards to a quantum recommendation algorithm. For example, in one or more embodiments described herein can compute binarized phase values from a given threshold value (e.g., a user-defined threshold). Further, one or more embodiments described herein can implement a thresholding scheme based on the binarized phase values using one or more qubit thresholding registers comprising three or more qubits, whose size can be dependent on the number of qubits in the qubit phase register. For instance, two or more threshold qubits from the thresholding register can be entangled to quantum states of the qubit phase register that correspond to phase regions above and/or below the computer binarized phase values. Additionally, an additional threshold qubit from the thresholding register can be conditionally entangled with the states of the other threshold qubits from the thresholding register, thereby identifying phase sectors of a Hilbert space that can correspond to phase regions greater than the given threshold.

The computer processing systems, computer-implemented methods, apparatus and/or computer program products employ hardware and/or software to solve problems that are highly technical in nature (e.g., thresholding a quantum recommendation algorithm), that are not abstract and cannot be performed as a set of mental acts by a human. For example, an individual, or even a plurality of individuals, cannot readily entangle various qubits of a quantum circuit based on quantum states of a qubit phase register.

FIG. 1 illustrates a block diagram of an example, non-limiting system 100 that can implement a thresholding scheme for a quantum recommendation algorithm based on one or more quantum states of a qubit phase register in accordance with one or more embodiments described herein. Repetitive description of like elements employed in other embodiments described herein is omitted for sake of brevity. Aspects of systems (e.g., system 100 and the like), apparatuses or processes in various embodiments of the present invention can constitute one or more machine-executable components embodied within one or more machines, e.g., embodied in one or more computer readable mediums (or media) associated with one or more machines. Such components, when executed by the one or more machines, e.g., computers, computing devices, virtual machines, etc. can cause the machines to perform the operations described.

As shown in FIG. 1, the system 100 can comprise one or more servers 102, one or more networks 104, and/or one or more input devices 106. The server 102 can comprise quantum recommendation component 108. The quantum recommendation component 108 can further comprise reception component 110, binarization component 112, and/or initialization component 114. Also, the server 102 can comprise or otherwise be associated with at least one memory 116. The server 102 can further comprise a system bus 118 that can couple to various components such as, but not limited to, the quantum recommendation component 108 and associated components, memory 116 and/or a processor 120. While a server 102 is illustrated in FIG. 1, in other embodiments, multiple devices of various types can be associated with or comprise the features shown in FIG. 1. Further, the server 102 can communicate with one or more cloud computing environments via the one or more networks 104.

The one or more networks 104 can comprise wired and wireless networks, including, but not limited to, a cellular network, a wide area network (WAN) (e.g., the Internet) or a local area network (LAN). For example, the server 102 can communicate with the one or more input devices 106 (and vice versa) using virtually any desired wired or wireless technology including for example, but not limited to: cellular, WAN, wireless fidelity (Wi-Fi), Wi-Max, WLAN, Bluetooth technology, a combination thereof, and/or the like. Further, although in the embodiment shown the quantum recommendation component 108 can be provided on the one or more servers 102, it should be appreciated that the architecture of system 100 is not so limited. For example, the quantum recommendation component 108, or one or more components of quantum recommendation component 108, can be located at another computer device, such as another server device, a client device, etc.

The one or more input devices 106 can comprise one or more computerized devices, which can include, but are not limited to: personal computers, desktop computers, laptop computers, cellular telephones (e.g., smart phones), computerized tablets (e.g., comprising a processor), smart watches, keyboards, touch screens, mice, a combination thereof, and/or the like. A user of the system 100 can utilize the one or more input devices 106 to input data into the system 100, thereby sharing (e.g., via a direct connection and/or via the one or more networks 104) said data with the server 102. For example, the one or more input devices 106 can send data to the reception component 110 (e.g., via a direct connection and/or via the one or more networks 104). Additionally, the one or more input devices 106 can comprise one or more displays that can present one or more outputs generated by the system 100 to a user. For example, the one or more displays can include, but are not limited to: cathode tube display ("CRT"), light-emitting diode display ("LED"), electroluminescent display ("ELD"), plasma display panel ("PDP"), liquid crystal display ("LCD"), organic light-emitting diode display ("OLED"), a combination thereof, and/or the like.

A user of the system 100 can utilize the one or more input devices 106 and/or the one or more networks 104 to input one or more settings and/or commands into the system 100. For example, in the various embodiments described herein, a user of the system 100 can operate and/or manipulate the server 102 and/or associate components via the one or more input devices 106. Additionally, a user of the system 100 can utilize the one or more input devices 106 to display one or more outputs (e.g., displays, data, visualizations, and/or the like) generated by the server 102 and/or associate components. In various embodiments, a user of the system 100 can utilize the one or more input devices 106 and/or the one or more networks 104 to provide the server 102 (e.g., the quantum recommendation component 108) with a threshold value, which can used to define preferred recommendation identified by a quantum recommendation algorithm, a preference matrix, and/or a user preference vector. For example, the preference matrix can comprise information regarding the preferences of one or more users of a product and/or service, encoded as one or more singular vectors. For instance, the preference matrix can comprise one or more conjugate pairs of eigenvalues that encode the preference information. Additionally, the user preference vectors can regard preference information regarding a particular user of the product and/or service.

In one or more embodiments, the one or more input devices 106 can be comprised within, and/or operably coupled to, a cloud computing environment. Cloud computing technologies can be utilized to collect and/or analyzed a wide variety of preference information to establish a preference matrix and/or user preference vector for a quantum recommendation algorithm.

The quantum recommendation component 108 can implement one or more thresholding schemes for execution of a quantum recommendation algorithm based on the data provided by the one or more input devices 106. For example, the reception component 110 can receive data from the one or more input devices 106 (e.g., via a direct electrical connection and/or through the one or more networks 104) and share the data with the various associate components of the quantum recommendation component 108.

The binarization component 112 can compute a plurality of binarized phase values from a given threshold (e.g., a threshold defined by a user of the system 100 via the one or more input devices 106). For example, the binarization component 112 can compute two binarized phase values, which can define two or more regions of a Hilbert space of the preference matrix that can comprise singular vectors with values greater than or equal to the given threshold. For instance, the binarization component 112 can compute the plurality of binarized phase values based on Equation 1 below.

$$\frac{\sigma}{\|A\|} = \cos\left(\frac{\theta^\pm}{2}\right) \quad (1)$$

Wherein "σ" can represent the given threshold, and/or "∥A∥" can be the Frobenius norm of the preference matrix, which can be represented as "A". Thus, the first binarized phase value can be in the form of:

$$\frac{\theta^+}{2\pi} = .0_1 0_2 \ldots 0_k 1_{k+1} 1_{k+2} \ldots 1_p$$

Also, the second binarized phase value can be in the form of:

$$\frac{\theta^-}{2\pi} = .1_1 1_2 \ldots 1_k 0_{k+1} 0_{k+2} \ldots 0_p$$

Wherein "p" can represent the number of qubits in a qubit phase register used to implement the quantum recommendation algorithm, "θ" can represent the phase value, and/or "k" can represent the number of significant digits in the subject binarized phase value. For example, the first binarized phase value can represent an upper threshold, wherein the zeros are the significant digits and "k" can represent the total number of zeros comprising the first binarized phase value. In another example, the second binarized phase value can represent a lower threshold, wherein the ones are the significant digits and "k" can represent the total number of ones comprising the second binarized phase value. Phase regions of the Hilbert space of the preference matrix that are less than the first binarized phase value and/or greater than the second binarized phase value can comprise singular vectors with values greater than the given threshold. The total number of digits comprising the binarized phase values can be equal to the number of qubits comprised within the qubit phase register.

The initialization component 114 can initialize a qubit thresholding register to an initial ground state (e.g., "|000>") and/or determine the number of qubits comprised within the qubit thresholding register. For example, the thresholding register can initially comprise three threshold qubits, each initialized to the ground state (e.g., represented by "0"). The thresholding register can also comprise additional threshold qubits depending on the binarized phase values and/or the number of qubits in the qubit phase register. As used herein, the term "work qubits" can refer to the number of threshold qubits (e.g., referred to herein as "work qubits") that can be included in the thresholding register in addition to the initial three threshold qubits. For example, the initialization component 114 can compute the number of work qubits in accordance with Equation 2 below.

If 3≤k<p; w=k−2

Else w=0 (2)

Wherein "w" can represent the number of work qubits. In the case where w≠0, a work register can be formed by the initialization component 114. The work register can be comprised within the threshold register and/or can comprise the work qubits initialized to a ground state (e.g., "|0_1 0_2 \ldots 0_w>"). In a case where w=0, the three initial threshold qubits of the threshold register can be sufficient to implement the thresholding scheme described herein.

For example, wherein the binarization component 112 computes 0.0011 and 0.1100 as the binarized phase values from the given threshold, the initialization component 114 can initialize the threshold register without any work qubits. For instance, the exemplary binarized phase values comprise two significant digits, thereby "k" equals two and "w" equals zero in accordance with Equation 2. In another example, wherein the binarization component 112 computes 0.0001 and 0.1110 as the binarized phase values from the given threshold, the initialization component 114 can initialize the threshold register with a work register comprising one work qubit. For instance, the exemplary binarized phase values comprise three significant digits, thereby "k" equals three and "w" equals one in accordance with Equation 2.

Thus, the binarization component 112 and/or the initialization component 114 can define the composition and/or characteristics of a threshold register based on the qubit phase register and/or defined threshold of the subject quantum recommendation algorithm. For example, the binarized phase values can be computed (e.g., via the binarization component 112) based on the given threshold and/or the singular values of a preference matrix. Further, the composition of the threshold register can be determined (e.g., via the initialization component 114) based on the computed binarized phase values and/or the number of qubits in the qubit phase register that facilitate execution of the quantum recommendation algorithm.

Figure 2:
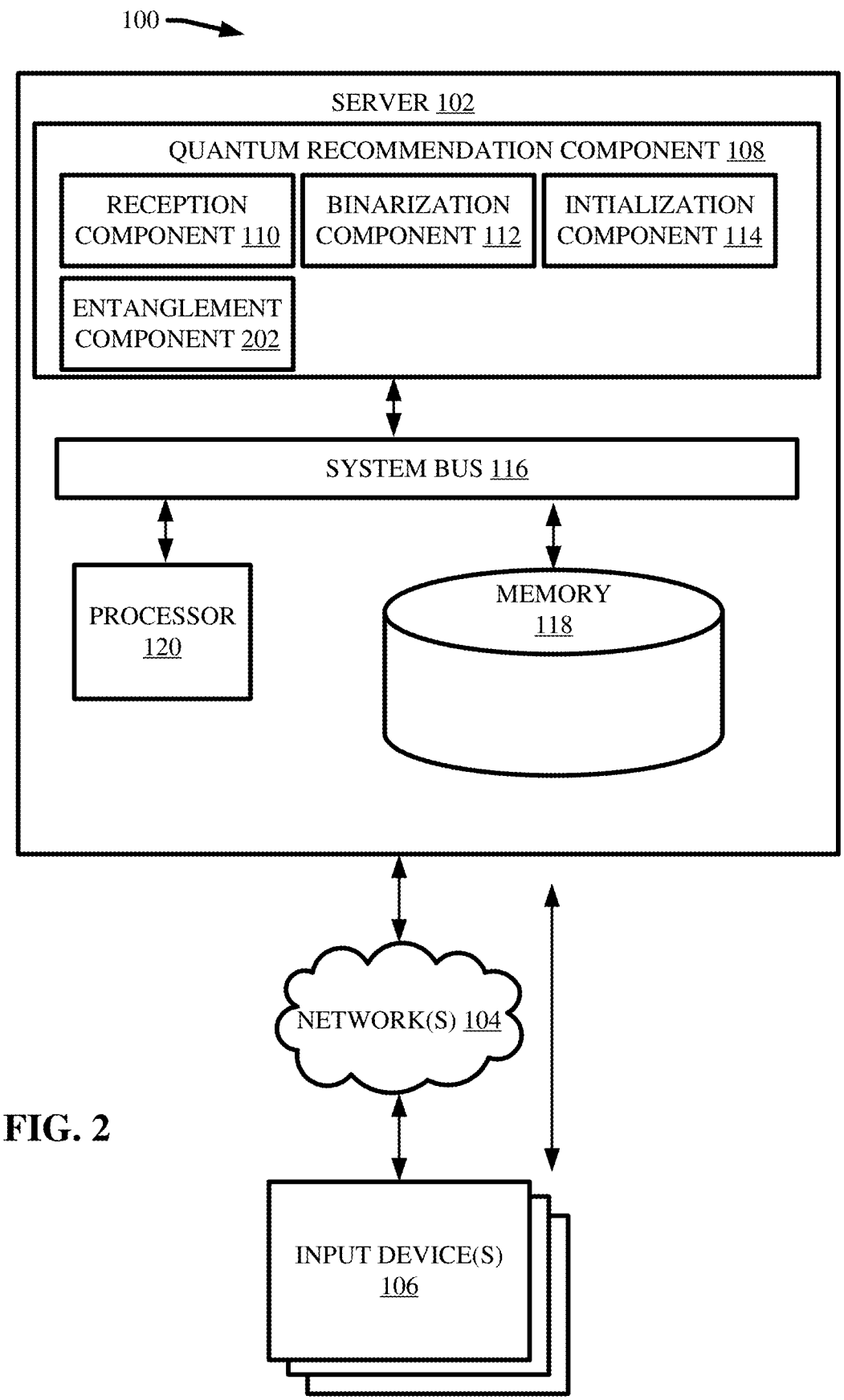
FIG. 2 illustrates a block diagram of an example, non-limiting system that can implement a thresholding scheme for a quantum recommendation algorithm based on one or more quantum states of a qubit phase register in accordance with one or more embodiments described herein.

FIG. 2 illustrates a diagram of the example, non-limiting system 100 further comprising entanglement component 202 in accordance with one or more embodiments described herein. Repetitive description of like elements employed in other embodiments described herein is omitted for sake of brevity. The entanglement component 202 can quantum entangle the various threshold and/or work qubits of the threshold register with quantum states of the qubit phase register to facilitate the thresholding scheme described herein.

For example, the entanglement component 202 can entangle a first threshold qubit of the threshold register to one or more quantum states of the qubit phase register that correspond to a first phase region of the Hilbert space of the preference matrix that is less than the first binarized phase value. Further, the entanglement component 202 can entangle a second threshold qubit of the threshold register to one or more quantum states of the qubit phase register that correspond to a second phase region of the Hilbert space that is greater than the second binarized phase value. In other words, singular values greater than or equal to the given threshold can be located in two phase regions of the Hilbert space in accordance with the relationship depicted in Equation 1 (e.g., at least because cosine is an even function). However, one of ordinary skill in the art will recognize that additional applicable phase regions can exist depending on other desired relationships between the phase values and singular values of the preference matrix. The entanglement component 202 can utilize one or more quantum gates to facilitate the entanglements between the threshold register and the qubit phase register. For instance, the entanglement component 202 can apply one or more Pauli-X quantum gate types onto the first and/or second threshold qubits of the threshold register, which can be controlled on the state of the qubits of the qubit phase register that correspond to the significant digits of the binarized phase values. For example, a Pauli-X quantum gate type applied to the first threshold qubit can be controlled by the quantum state of qubits comprised within the qubit phase register in accordance with the first binarized phase value. Additionally, a Pauli-X quantum gate type applied to the second threshold qubit can be controlled by the quantum state of the qubit phase register in accordance with the second binarized phase value.

Wherein the binarized phase values comprise greater than two significant digits, the entanglement component 202 can also entangle the one or more work qubits to the quantum states of the qubit phase register. For example, where the first threshold qubit is controlled by three or more qubits of the qubit phase register, one or more work qubits can be utilized to implement an n-controlled quantum gate applied to the first threshold qubit, wherein "n" can represent the number of corresponding qubits in the qubit phase register and is greater than or equal to three. Likewise, where the second threshold qubit is controlled by three or more qubits of the qubit phase register, one or more work qubits can be utilized to implement an n-controlled quantum gate applied to the second threshold qubit, wherein "n" can represent the number of corresponding qubits in the qubit phase register and is greater than or equal to three. For instance, wherein $n \geq 3$, the entanglement component 202 can apply one or more Toffoli quantum gates to entangle the subject qubits of the phase register (e.g., three or more qubits of the phase register) to one or more of the work qubits, which can then be entangled (e.g., via one or more additional quantum gates, such as Toffoli gates) to the target threshold qubit (e.g., the first threshold qubit or the second threshold qubit depending on the subject binarized phase value). Thus, the entanglement component 202 can utilize work qubits to facilitate an entanglement of the qubit phase register and the first or second threshold qubits when the number of controlling qubits (e.g., qubits of the qubit phase register) are greater than or equal to three.

Additionally, the entanglement component 202 can entangle the entangled threshold and/or work qubits to another threshold qubit of the threshold register. For example, the first threshold qubit and the second threshold qubit can be entangled to a third threshold qubit of the threshold register. Further, wherein one or more work qubits are entangled with one or more qubits from the qubit phase register, the one or more work qubits can also be entangled with the first or second threshold qubit. For instance, two or more controlled NOT ("CNOT") quantum gates can be applied to the third threshold qubit, wherein each of the CNOT quantum gates can entangle the third threshold qubit with the first and/or second threshold qubits. For instance, a first CNOT quantum gate applied to the third threshold qubit can facilitate entanglement with the first threshold qubit, and a second CNOT quantum gate applied to the third threshold qubit can facilitate entanglement with the second threshold qubit.

Thereby, the quantum state of the third threshold qubit can be based on the quantum states of the first and/or second threshold qubits entangled with the qubit phase register (e.g., via one or more work qubits in some instances). Since the quantum state of the first and/or second threshold qubits entangled with the qubit phase register can be based on the binarized phase values, the quantum state of the third threshold qubit can serve to identify the plurality of phase regions of the Hilbert space that correspond to singular values greater than or equal to the given threshold.

Figure 3:
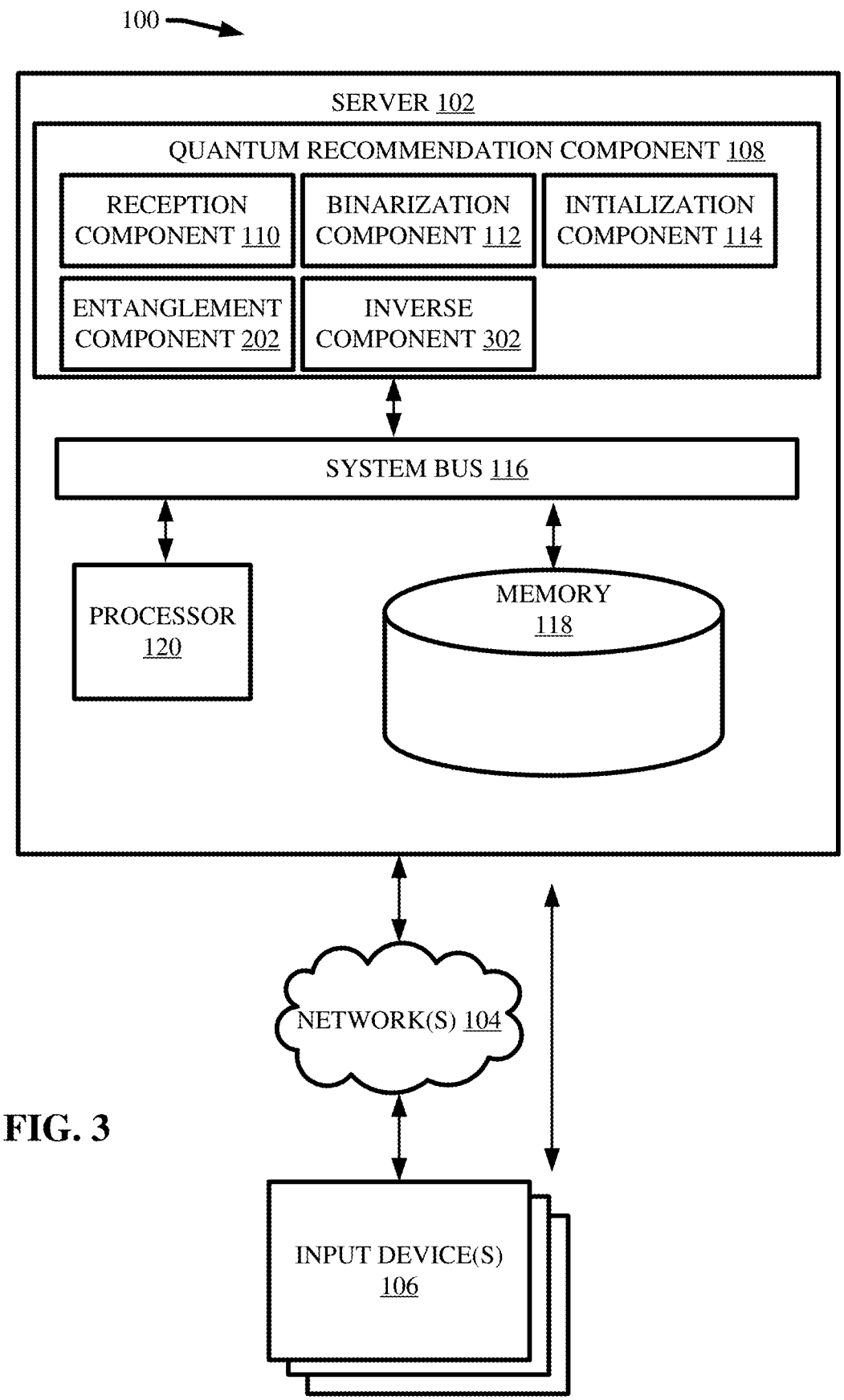
FIG. 3 illustrates a block diagram of an example, non-limiting system that can implement a thresholding scheme for a quantum recommendation algorithm based on one or more quantum states of a qubit phase register in accordance with one or more embodiments described herein.

FIG. 3 illustrates a diagram of the example, non-limiting system 100 further comprising inverse component 302 in accordance with one or more embodiments described herein. Repetitive description of like elements employed in other embodiments described herein is omitted for sake of brevity. The inverse component 302 can reverse the entanglement between the threshold register and the qubit phase register implemented by the entanglement component 202 to facilitate execution of the subject quantum recommendation algorithm.

For example, the inverse component 302 can execute a quantum circuit inverse of the quantum circuit executed by the entanglement component 202, which entangled the first and/or second threshold qubits to the third threshold qubit. However, the quantum entanglement established between the third threshold qubit and the qubit phase register can remain despite the inverse implemented by the inverse component 302. For instance, execution of the quantum circuit inverse by the inverse component 302 can deconstruct the entanglement established by the one or more Pauli-X quantum gate types controlled by the quantum states of qubits in the qubit phase register. Thus, the inverse component 302 can uncompute the first and/or second threshold qubits such that the first and/or second threshold qubits can be reset to the ground state and no longer be entangled, while the third threshold qubit can remain entangled to the qubit phase register. Further, the inverse component 302 can uncompute any work qubits used to facilitate the entanglements described herein such that the work qubits can also be reset to the ground state and no longer be entangled. By uncomputing the work qubits, the work qubits can be reused for other quantum gates in the quantum recommendation algorithm.

Figure 4:
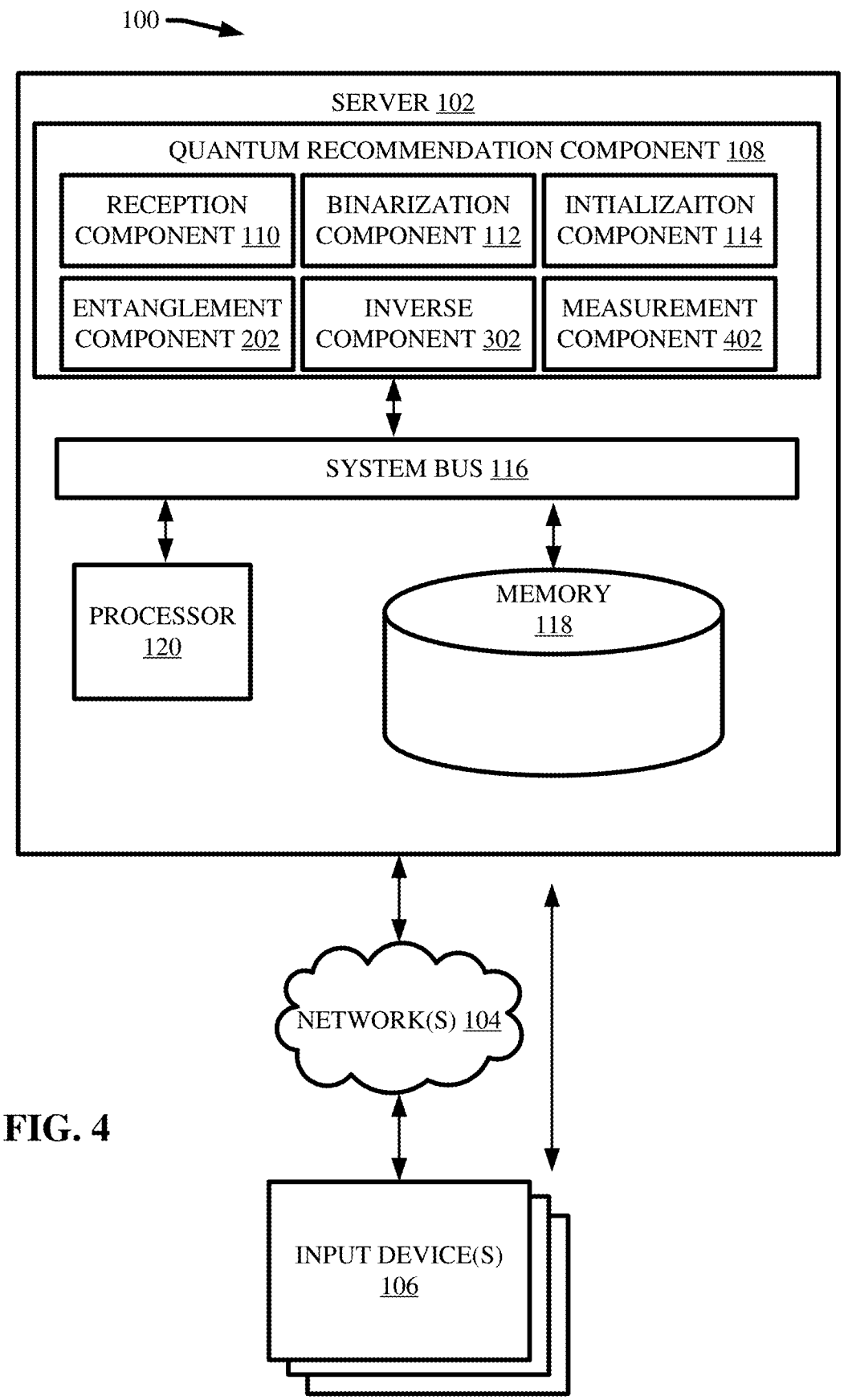
FIG. 4 illustrates a block diagram of an example, non-limiting system that can implement a thresholding scheme for a quantum recommendation algorithm based on one or more quantum states of a qubit phase register in accordance with one or more embodiments described herein.

FIG. 4 illustrates a diagram of the example, non-limiting system 100 further comprising measurement component 402 in accordance with one or more embodiments described herein. Repetitive description of like elements employed in other embodiments described herein is omitted for sake of brevity. The measurement component 402 can measure the state of the third threshold qubit to determine whether a subject singular value of the preference matrix is located in a phase region of the Hilbert space delineated by the plurality of binarized phase values.

For example, the measurement component 402 can measure the state of the third threshold qubit to determine whether the preference vector is projected onto the singular vectors corresponding to a singular value that is greater than or equal to the given threshold. Additionally, the measurement component 402 can measure the state of the third threshold qubit to determine whether the subject singular value is located in phase region greater than the second binarized phase value. Thus, the third threshold qubit, which can be entangled to the plurality of other threshold and/or work qubits of the threshold register, can flag phase regions of the Hilbert space that can comprise singular values greater than the given threshold. For instance, wherein the measurement component 402 measures the quantum state of the third threshold qubit and the outcome is one, the measurement component 402 can determine that the subject preference vector is being projected onto a portion of the Hilbert space of the preference matrix that comprises singular values greater than or equal to the given threshold.

Thus, the quantum recommendation component 108 can identify one or more phase regions of the Hilbert space of the preference matrix that can comprise singular values greater than or equal to a defined threshold based on the quantum state of the one or more qubits comprised within a qubit phase register. For example, the binarization techniques described herein can facilitate the construction of a threshold register that can be quantum entangled with the qubit phase register. Monitoring one or more outcomes of the threshold register (e.g., monitoring the state of the third threshold qubit, which can be reflective of the quantum states of the other qubits comprised within the threshold register) can facilitate the identification of the desired phase regions. Thereby, the quantum recommendation component 108 can implement one or more quantum recommendation algorithms to project the preference vector onto the identified phase regions of the Hilbert space of the preference matrix to meet the constraints defined by the given threshold.

Figure 5A:
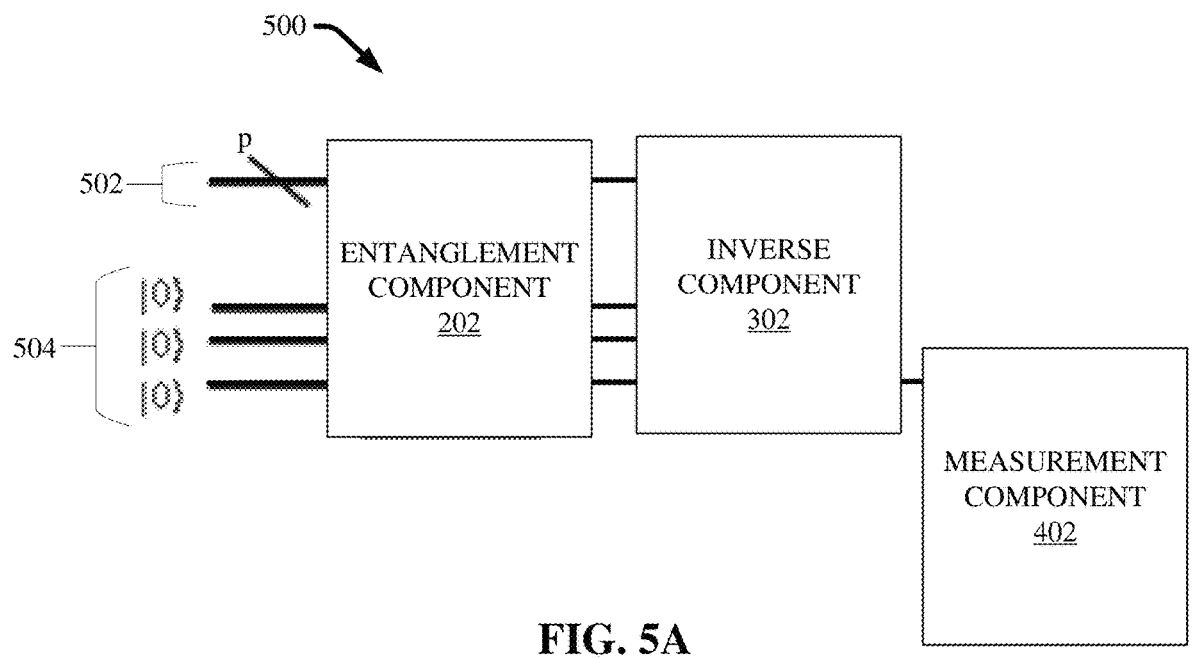
FIG. 5A illustrates a diagram of an example, non-limiting quantum circuit that can facilitate execution of one or more features of a quantum recommendation algorithm in accordance with one or more embodiments described herein.

FIG. 5A illustrates a diagram of an example, non-limiting quantum circuit 500 that can facilitate implementation of the thresholding scheme performed by the system 100 in accordance with one or more embodiments described herein. Repetitive description of like elements employed in other embodiments described herein is omitted for sake of brevity. As shown in FIG. 5A, the top line 502 of the quantum circuit 500 can represent the qubit phase register described herein, comprising "p" number of qubits. Additionally, the three bottom lines 504 of the quantum circuit 500 can represent the threshold register described herein, comprising the initial three threshold qubits initialized to a ground state.

The entanglement component 202 can be operably coupled to the qubit phase register and/or the threshold register to facilitate the quantum entanglement described herein. For example, the threshold and/or work qubits comprising the threshold register can be entangled with the qubits comprising the qubit phase register based on the plurality of binarized phase values computed from the given threshold. Additionally, the inverse component 302 can be operably coupled to the qubit phase register and/or the threshold register to facilitate the uncomputing described herein. Further, the third threshold qubit of the threshold register can be operably coupled to the measurement component 402 to monitor the state of the third threshold qubit, as described herein.

Figure 5B:
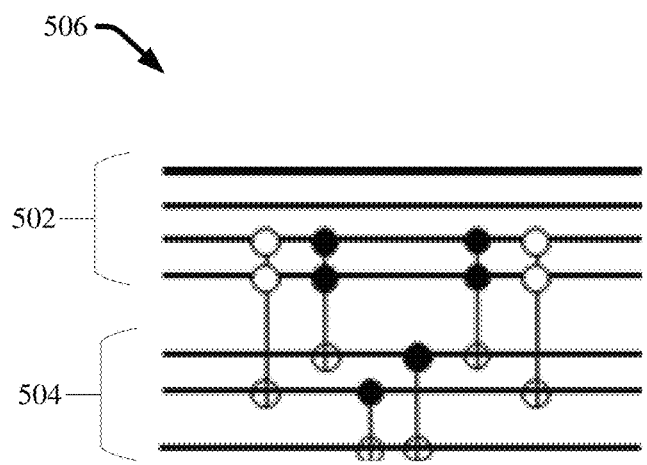
FIG. 5B illustrates a diagram of an example, non-limiting quantum circuit that can facilitate execution of one or more features of a quantum recommendation algorithm in accordance with one or more embodiments described herein.

FIG. 5B illustrates a diagram of an example, non-limiting quantum gate layout 506 that can be implemented by the entanglement component 202 and/or the inverse component 302 to facilitate the one or more of the quantum entanglements described herein. Repetitive description of like elements employed in other embodiments described herein is omitted for sake of brevity. The quantum gate layout 506 depicted in FIG. 5B can regard a qubit phase register comprising 4 qubits, wherein the binarized phase values computed by the binarization component 112 can be 0.0011 and 0.1100. As shown in FIG. 5B, the initialization component 114 can initialize a threshold register comprising just the three initial threshold qubits at least because no work qubits are required based on the binarization phase values and Equation 2.

As shown in FIG. 5B, the first threshold qubit and the second threshold qubit are entangled with the qubits of the qubit phase register based on the computed binarized phase values. For example, a Toffoli quantum gate applied to the first threshold qubit can exemplify how the first threshold qubit can be controlled by the quantum states of the qubits comprised in the qubit phase register based on the first binarized phase value (e.g., 0.0011). Likewise, a Toffoli quantum gate applied to the second threshold qubit can exemplify how the second threshold qubit can be controlled by the quantum states of the qubits comprised in the qubit phase register based on the second binarized phase value (e.g., 0.1100). For instance, two n-controlled NOT quantum gates are depicted in the thresholding scheme characterized by quantum gate layout 506. As shown in FIG. 5B, a NOT quantum gate can entangle the first threshold qubit to control qubits of the qubit phase register (e.g., two control qubits) if the control qubits are in the "1" state (e.g., represented by filled circles on the control qubits), while another NOT quantum gate can entangle the second threshold qubit to control qubits of the qubit phase register if the control qubits are in the "0" state (e.g., represented by open circles on the control qubits). Thereby, the quantum gate layout 506 can account for the binarized phase values computed from the given threshold. Further, the two CNOT quantum gates applied to the third threshold qubit of the threshold register can exemplify how the third threshold qubit can be entangled with the quantum states of the other threshold and/or work qubits comprised within the threshold register (e.g. the first threshold qubit and the second threshold qubit). Additionally, one of ordinary skill in the art will readily recognize that the architecture depicted by FIG. 5B is exemplary and/or alternate quantum gate schemes that can achieve the described entanglement are also envisaged. Moreover, two n-controlled NOT quantum gates can be applied (e.g., via the inverse component 302) between the qubits in the phase register and the first and second threshold qubits to facilitate the uncomputing described herein.

Figure 6:
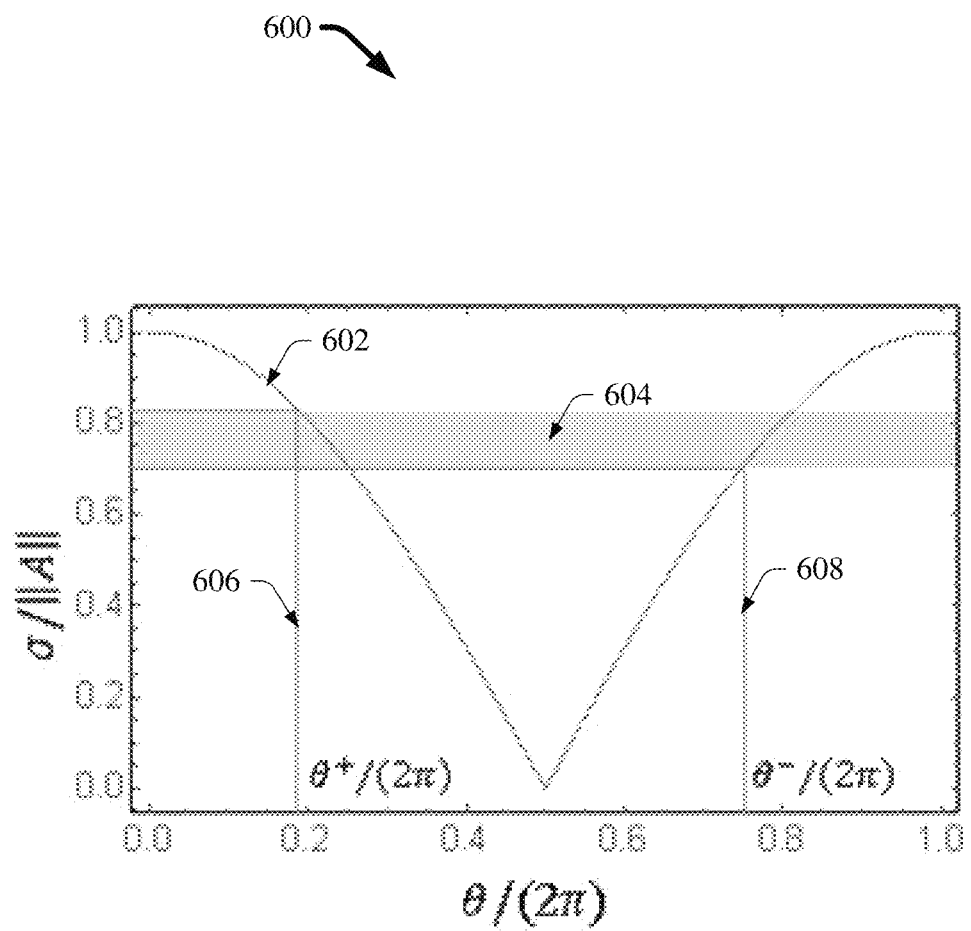
FIG. 6 illustrates a diagram of an example, non-limiting graph that can depict a Hilbert space upon which one or more preference vectors can be projected by a quantum recommendation algorithm in accordance with one or more embodiments described herein.

FIG. 6 illustrates a diagram of an example, non-limiting graph 600 depicting a Hilbert space comprising one or more phase regions that meet the criteria defined by a given threshold and/or can be identified by the quantum recommendation component 108 in accordance with one or more embodiments described herein. Repetitive description of like elements employed in other embodiments described herein is omitted for sake of brevity. Line 602 of graph 600 can represent the singular values of the subject preference matrix. Also, band 604 of graph 600 can correspond to the given threshold as represented by the first exemplary binarized phase value 606 and the second exemplary binarized phase value 608. As shown in FIG. 6, singular values located in a portion of the Hilbert space that is greater than or equal to the given threshold are also located in a first phase region that is less than the first binarized phase value along the x-axis and/or greater than the second binarized phase value along the x-axis. Thus, by identifying singular values within these phase regions (e.g., via the one or more binarizations and/or entanglements described herein), the quantum recommendation component 108 can identify singular values that are greater than or equal to the given threshold.

Figure 7:
FIG. 7 illustrates a diagram of an example, non-limiting table that can depict one or more exemplary binarizations and/or computations that can be performed by a quantum recommendation algorithm in accordance with one or more embodiments described herein.

FIG. 7 illustrates a diagram of an example, non-limiting table 700 that can depict one or more exemplary binarizations and/or calculations that can be made by the system 100 in accordance with one or more embodiments described herein. Repetitive description of like elements employed in other embodiments described herein is omitted for sake of brevity. The exemplary data depicted in table 700 can regard a qubit phase register comprising four qubits. A first binarized phase value equal to 0.00002 can correspond to a threshold of unity such that no singular values are kept (e.g., except wherein the preference matrix is a rank one so that there is only one non-zero singular value). In contrast, a second binarized phase value equal to 0.11112 can be equivalent to keeping all singular values of the preference matrix.

Figure 8:
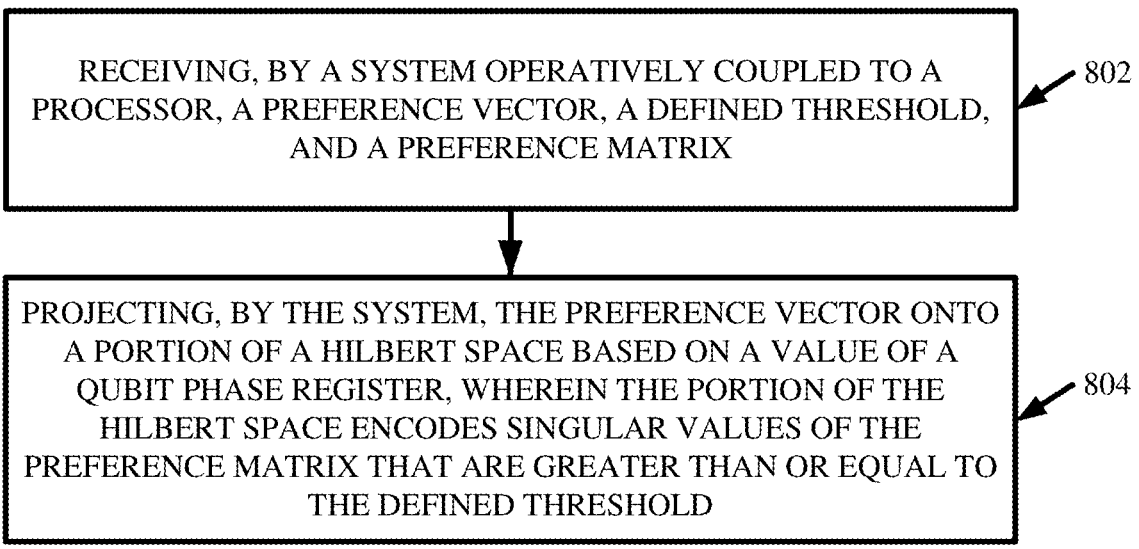
FIG. 8 illustrates a flow diagram of an example, non-limiting method that can facilitate implementation of a thresholding scheme for a quantum recommendation algorithm based on one or more quantum states of a qubit phase register in accordance with one or more embodiments described herein.

FIG. 8 illustrates a flow diagram of an example, non-limiting method 800 that can facilitate implementation of a thresholding scheme based on the quantum states of a qubit phase register in accordance with one or more embodiments described herein. Repetitive description of like elements employed in other embodiments described herein is omitted for sake of brevity.

At 802, the method 800 can comprise receiving, by a system 100 (e.g., via reception component 110) operatively coupled to a processor 120 (e.g., a superconducting quantum processor), a preference vector, a define threshold, and/or a preference matrix. As described herein, input data (e.g., the preference vector, the defined threshold, and/or the preference matrix can be entered into the system 100 via one or more input devices 106 and/or one or more networks 104. For example, input data can regard the preferences of one or more users of a good and/or service collected and/or analyzed via one or more cloud computing environments. The system 100 can utilize the input data to execute one or more quantum recommendation algorithms, which can generate one or more recommendations with a specificity honed by the thresholding scheme described herein in accordance with the defined threshold (e.g., a user defined threshold).

At 804, the method 800 can comprise projecting, by the system 100 (e.g., via the associate components of the quantum recommendation component 108) the preference vector onto a portion of a Hilbert space based on a value of a qubit phase register. The portion of the Hilbert space can encode singular values of the preference matrix that are greater than or equal to the defined threshold. As described herein, the quantum recommendation component 108 can implement a thresholding scheme that comprises entangling qubits of the qubit phase register with qubits of a threshold register such that phase regions of the Hilbert space that comprise singular values that meet the constraints of the defined threshold can be identified based on the quantum states of the qubit phase register.

Figure 9:
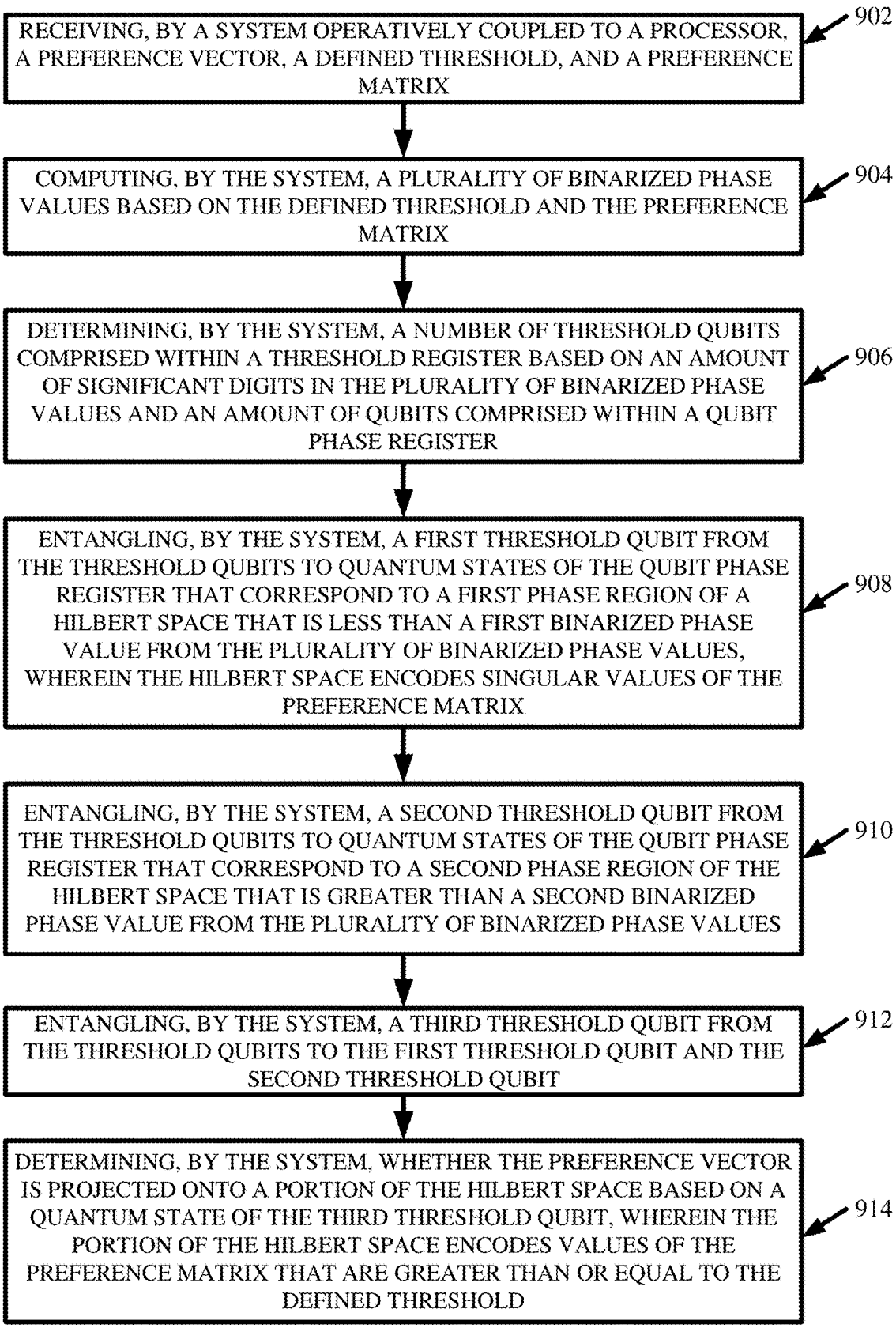
FIG. 9 illustrates a flow diagram of an example, non-limiting method that can facilitate implementation of a thresholding scheme for a quantum recommendation algorithm based on one or more quantum states of a qubit phase register in accordance with one or more embodiments described herein.

FIG. 9 illustrates a flow diagram of an example, non-limiting method 900 that can facilitate implementation of a thresholding scheme based on the quantum states of a qubit phase register in accordance with one or more embodiments described herein. Repetitive description of like elements employed in other embodiments described herein is omitted for sake of brevity.

At 902, the method 900 can comprise receiving, by a system 100 (e.g., via reception component 110) operatively coupled to a processor 120 (e.g., a superconducting quantum processor), a preference vector, a define threshold, and/or a preference matrix. As described herein, input data (e.g., the preference vector, the defined threshold, and/or the preference matrix can be entered into the system 100 via one or more input devices 106 and/or one or more networks 104. For example, input data can regard the preferences of one or more users of a good and/or service collected and/or analyzed via one or more cloud computing environments. The system 100 can utilize the input data to execute one or more quantum recommendation algorithms, which can generate one or more recommendations with a specificity honed by the thresholding scheme described herein in accordance with the defined threshold (e.g., a user defined threshold).

At 904, the method 900 can comprise computing, by the system 100 (e.g., via the binarization component 112), a plurality of binarized phase values based on the defined threshold and/or the preference matrix. For example, the computing at 904 can be performed in accordance with Equation 1 described herein.

At 906, the method 900 can comprise determining, by the system 100 (e.g., via the initialization component 114), a number of threshold qubits comprised within a threshold register based on an amount of significant digits in the plurality of binarized phase values and/or an amount of qubits comprised within a qubit phase register executing the subject quantum recommendation algorithm. For example, the determining at 906 can be performed in accordance with Equation 2 described herein. For instance, the computer at 906 can include determining the number of work qubits that can be included in a work register, which can be comprised within the threshold register. Further, the qubits comprised within the threshold register (e.g., the threshold qubits and/or the work qubits) can be initialized to a ground state, as described herein.

At 908, the method 900 can comprise entangling, by the system 100 (e.g., via the entanglement component 202), a first threshold qubit from the threshold qubits to one or more quantum states of the qubit phase register that can correspond to a first phase region of a Hilbert space that is less than a first binarized phase value from the plurality of binarized phase values computed at 904. The Hilbert space can encode singular values of the preference matrix. For example, one or more quantum gates (e.g., Pauli-X quantum gate types) can be applied to the first threshold qubit to entangle the first threshold qubit to qubits comprised within the qubit phase register based on the first binarized phase value (e.g., as shown in the exemplary quantum gate layout 506 depicted in FIG. 5B).

At 910, the method 900 can comprise entangling, by the system 100 (e.g., via the entanglement component 202), a second threshold qubit from the threshold qubits to one or more quantum states of the qubit phase register that can correspond to a second phase region of the Hilbert space that is greater than a second binarized phase value from the plurality of binarized phase values computed at 904. For example, one or more quantum gates (e.g., Pauli-X quantum gate types) can be applied to the second threshold qubit to entangle the second threshold qubit to qubits comprised within the qubit phase register based on the second binarized phase value (e.g., as shown in the exemplary quantum gate layout 506 depicted in FIG. 5B). Additionally, in one or more embodiments, the method 900 can comprise entangling one or more work qubits of the threshold register with one or more qubits of the qubit phase register based on the binarized phase values.

At 912, the method 900 can comprise entangling, by the system 100 (e.g., via the entanglement component 202), a third threshold qubit from the threshold qubits to the first threshold qubit and/or the second threshold qubit. For example, two or more quantum gates (e.g., CNOT quantum gates) can be applied to the third threshold qubit to entangle the third threshold qubit to the other qubits of the threshold register (e.g., threshold qubits and/or work qubits), which can be further entangled with the qubit phase register (e.g., as show in the exemplary quantum gate layout 506 depicted in FIG. 5B).

At 914, the method 900 can comprise determining, by the system 100 (e.g., via the measurement component 402), whether the preference vector is projected onto a portion of the Hilbert space based on a quantum state of the third threshold qubit entangled at 912. The portion of the Hilbert space can encode values of the preference matrix that are greater than or equal to the defined threshold. For example, the state of the third threshold qubit can identify the first phase region and/or the second phase region defined by the binarized phase values, which in turn can delineate the portion of the Hilbert space that can comprise singular values greater than or equal to the defined value.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 10:
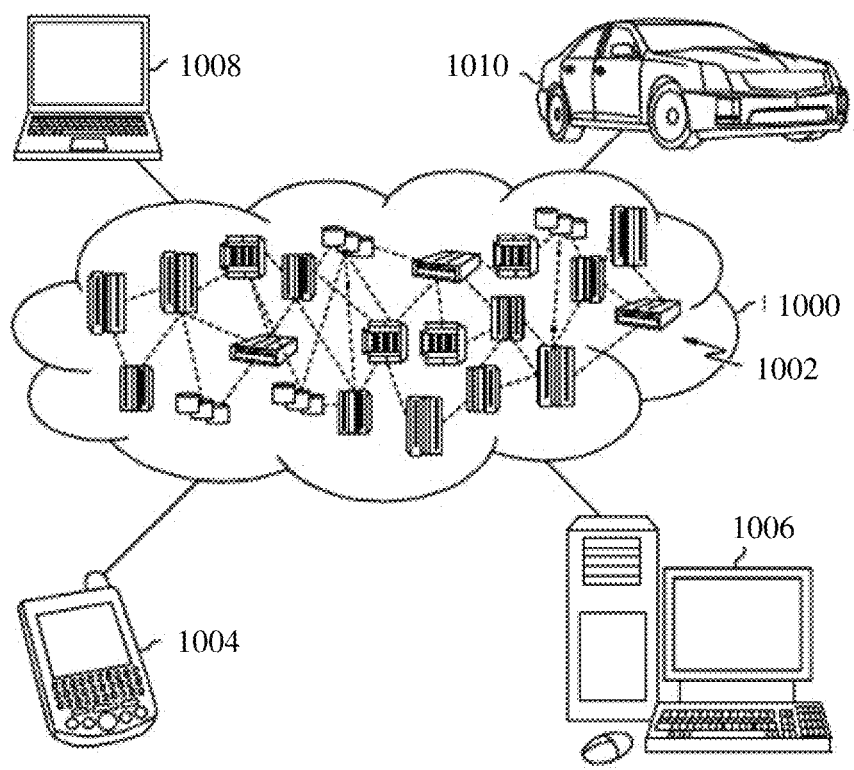
FIG. 10 depicts a cloud computing environment in accordance with one or more embodiments described herein.

Referring now to FIG. 10, illustrative cloud computing environment 1000 is depicted. As shown, cloud computing environment 1000 includes one or more cloud computing nodes 1002 with which local computing devices used by cloud consumers, such as, for example, personal digital assistant (PDA) or cellular telephone 1004, desktop computer 1006, laptop computer 1008, and/or automobile computer system 1010 may communicate. Nodes 1002 may communicate with one another. They may be grouped (not shown) physically or virtually, in one or more networks, such as Private, Community, Public, or Hybrid clouds as described hereinabove, or a combination thereof. This allows cloud computing environment 1000 to offer infrastructure, platforms and/or software as services for which a cloud consumer does not need to maintain resources on a local computing device. It is understood that the types of computing devices 1004-1010 shown in FIG. 10 are intended to be illustrative only and that computing nodes 1002 and cloud computing environment 1000 can communicate with any type of computerized device over any type of network and/or network addressable connection (e.g., using a web browser).

Figure 11:
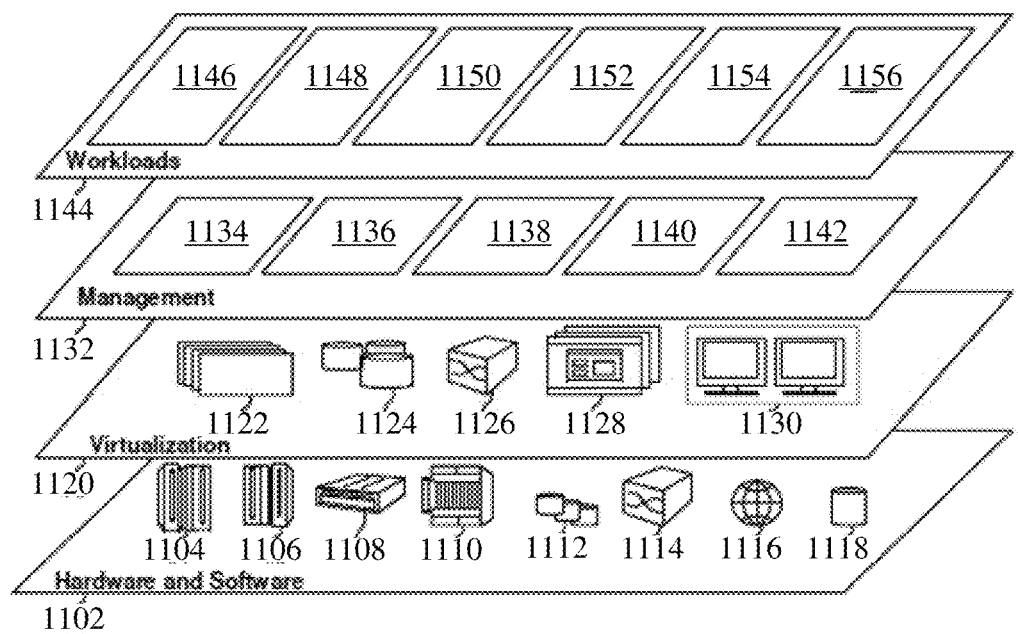
FIG. 11 depicts abstraction model layers in accordance with one or more embodiments described herein

Referring now to FIG. 11, a set of functional abstraction layers provided by cloud computing environment 1000 (FIG. 10) is shown. Repetitive description of like elements employed in other embodiments described herein is omitted for sake of brevity. It should be understood in advance that the components, layers, and functions shown in FIG. 11 are intended to be illustrative only and embodiments of the invention are not limited thereto. As depicted, the following layers and corresponding functions are provided.

Hardware and software layer 1102 includes hardware and software components. Examples of hardware components include: mainframes 1104; RISC (Reduced Instruction Set Computer) architecture based servers 1106; servers 1108; blade servers 1110; storage devices 1112; and networks and networking components 1114. In some embodiments, software components include network application server software 1116 and database software 1118.

Virtualization layer 1120 provides an abstraction layer from which the following examples of virtual entities may be provided: virtual servers 1122; virtual storage 1124; virtual networks 1126, including virtual private networks; virtual applications and operating systems 1128; and virtual clients 1130.

In one example, management layer 1132 may provide the functions described below. Resource provisioning 1134 provides dynamic procurement of computing resources and other resources that are utilized to perform tasks within the cloud computing environment. Metering and Pricing 1136 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1138 provides access to the cloud computing environment for consumers and system administrators. Service level management 1140 provides cloud computing resource allocation and management such that required service levels are met. Service Level Agreement (SLA) planning and fulfillment 1142 provide pre-arrangement for, and procurement of, cloud computing resources for which a future requirement is anticipated in accordance with an SLA.

Workloads layer 1144 provides examples of functionality for which the cloud computing environment may be utilized. Examples of workloads and functions which may be provided from this layer include: mapping and navigation 1146; software development and lifecycle management 1148; virtual classroom education delivery 1150; data analytics processing 1152; transaction processing 1154; and preference data collection and/or preparation 956. Various embodiments of the present invention can utilize the cloud computing environment described with reference to FIGS. 10 and 11 to derive preference matrices that can be utilized to execute one or more quantum recommendation algorithms, as described herein.

The present invention may be a system, a method, and/or a computer program product at any possible technical detail level of integration. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware based systems that perform the specified functions or acts or carry out combinations of special purpose hardware and computer instructions.

Figure 12:
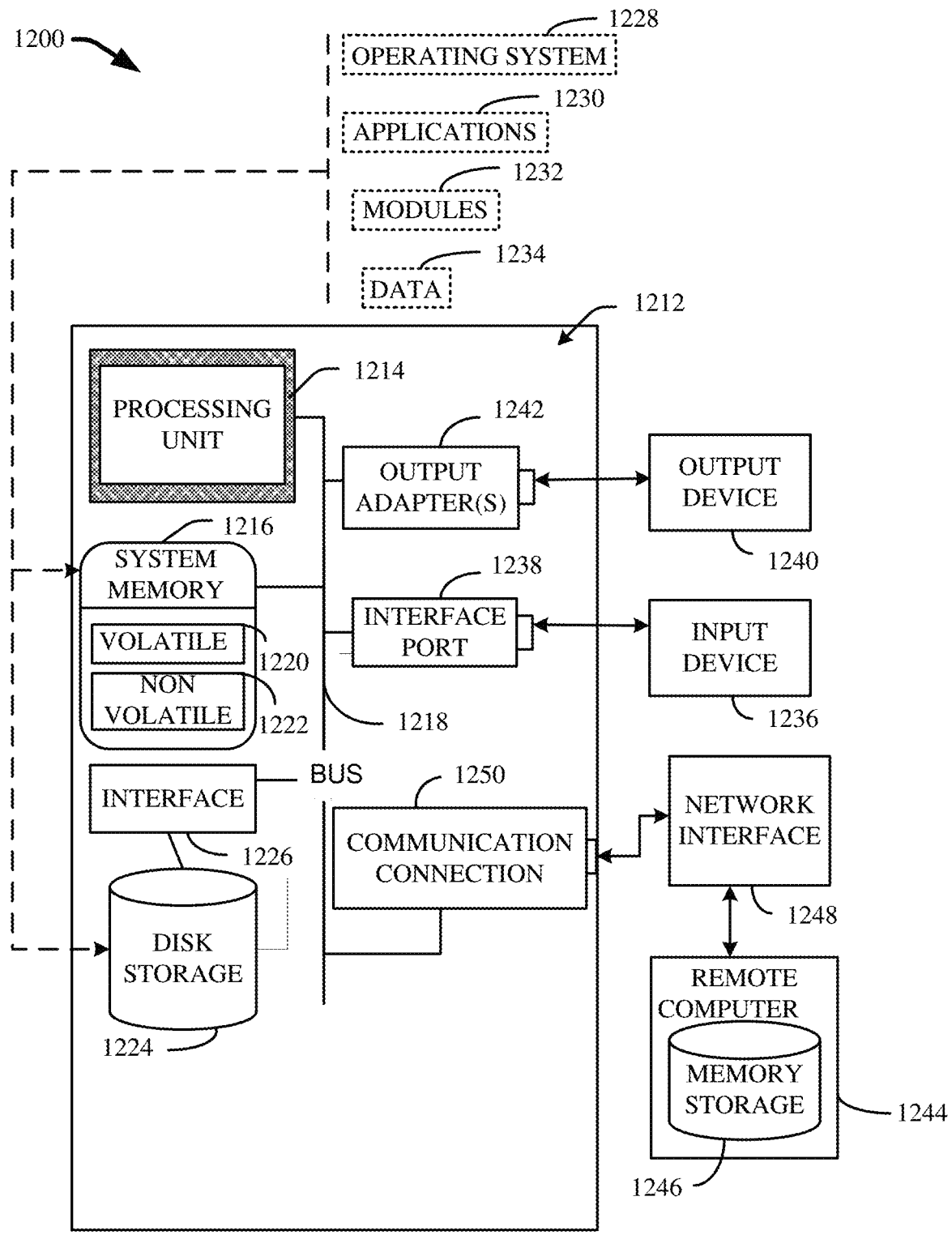
FIG. 12 illustrates a block diagram of an example, non-limiting operating environment in which one or more embodiments described herein can be facilitated.

In order to provide a context for the various aspects of the disclosed subject matter, FIG. 12 as well as the following discussion are intended to provide a general description of a suitable environment in which the various aspects of the disclosed subject matter can be implemented. FIG. 12 illustrates a block diagram of an example, non-limiting operating environment in which one or more embodiments described herein can be facilitated. Repetitive description of like elements employed in other embodiments described herein is omitted for sake of brevity. With reference to FIG. 12, a suitable operating environment 1200 for implementing various aspects of this disclosure can include a computer 1212. The computer 1212 can also include a processing unit 1214, a system memory 1216, and a system bus 1218. The system bus 1218 can operably couple system components including, but not limited to, the system memory 1216 to the processing unit 1214. The processing unit 1214 can be any of various available processors. Dual microprocessors and other multiprocessor architectures also can be employed as the processing unit 1214. The system bus 1218 can be any of several types of bus structures including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire, and Small Computer Systems Interface (SCSI). The system memory 1216 can also include volatile memory 1220 and nonvolatile memory 1222. The basic input/output system (BIOS), containing the basic routines to transfer information between elements within the computer 1212, such as during start-up, can be stored in nonvolatile memory 1222. By way of illustration, and not limitation, nonvolatile memory 1222 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1220 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1212 can also include removable/non-removable, volatile/non-volatile computer storage media. FIG. 12 illustrates, for example, a disk storage 1224. Disk storage 1224 can also include, but is not limited to, devices like a magnetic disk drive, floppy disk drive, tape drive, Jaz drive, Zip drive, LS-100 drive, flash memory card, or memory stick. The disk storage 1224 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1224 to the system bus 1218, a removable or non-removable interface can be used, such as interface 1226. FIG. 12 also depicts software that can act as an intermediary between users and the basic computer resources described in the suitable operating environment 1200. Such software can also include, for example, an operating system 1228. Operating system 1228, which can be stored on disk storage 1224, acts to control and allocate resources of the computer 1212. System applications 1230 can take advantage of the management of resources by operating system 1228 through program modules 1232 and program data 1234, e.g., stored either in system memory 1216 or on disk storage 1224. It is to be appreciated that this disclosure can be implemented with various operating systems or combinations of operating systems. A user enters commands or information into the computer 1212 through one or more input devices 1236. Input devices 1236 can include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices can connect to the processing unit 1214 through the system bus 1218 via one or more interface ports 1238. The one or more Interface ports 1238 can include, for example, a serial port, a parallel port, a game port, and a universal serial bus (USB). One or more output devices 1240 can use some of the same type of ports as input device 1236. Thus, for example, a USB port can be used to provide input to computer 1212, and to output information from computer 1212 to an output device 1240. Output adapter 1242 can be provided to illustrate that there are some output devices 1240 like monitors, speakers, and printers, among other output devices 1240, which require special adapters. The output adapters 1242 can include, by way of illustration and not limitation, video and sound cards that provide a means of connection between the output device 1240 and the system bus 1218. It should be noted that other devices and/or systems of devices provide both input and output capabilities such as one or more remote computers 1244.

Computer 1212 can operate in a networked environment using logical connections to one or more remote computers, such as remote computer 1244. The remote computer 1244 can be a computer, a server, a router, a network PC, a workstation, a microprocessor based appliance, a peer device or other common network node and the like, and typically can also include many or all of the elements described relative to computer 1212. For purposes of brevity, only a memory storage device 1246 is illustrated with remote computer 1244. Remote computer 1244 can be logically connected to computer 1212 through a network interface 1248 and then physically connected via communication connection 1250. Further, operation can be distributed across multiple (local and remote) systems. Network interface 1248 can encompass wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). One or more communication connections 1250 refers to the hardware/software employed to connect the network interface 1248 to the system bus 1218. While communication connection 1250 is shown for illustrative clarity inside computer 1212, it can also be external to computer 1212. The hardware/software for connection to the network interface 1248 can also include, for exemplary purposes only, internal and external technologies such as, modems including regular telephone grade modems, cable modems and DSL modems, ISDN adapters, and Ethernet cards.

Embodiments of the present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of various aspects of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device including, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components including a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
a memory that stores computer executable components; and
a processor, operably coupled to the memory, and that executes the computer executable components stored in the memory, wherein the computer executable components comprise:
a quantum recommendation component that projects a preference vector onto a portion of a Hilbert space based on a value of a qubit phase register, wherein the portion of the Hilbert space encodes singular values of a preference matrix that are greater than or equal to a defined threshold.

2. The system of claim 1, further comprising:
a binarization component that computes a plurality of binarized phase values based on the defined threshold and the preference matrix.

3. The system of claim 2, further comprising:
an initialization component that determines a number of threshold qubits comprised within a threshold register based on an amount of significant digits in the plurality of binarized phase values and an amount of qubits comprised within the qubit phase register, wherein the threshold qubits are entangled with quantum states of the qubit phase register to identify the portion of the Hilbert space.

4. The system of claim 2, further comprising:
an entanglement component that entangles a first threshold qubit from a threshold register to quantum states of the qubit phase register that correspond to a first phase region of the Hilbert space that is less than a first binarized phase value from the plurality of binarized phase values.

5. The system of claim 4, wherein the entanglement component further entangles a second threshold qubit from the threshold register to quantum states of the qubit phase register that correspond to a second phase region of the Hilbert space that is greater than a second binarized phase value from the plurality of binarized phase values.

6. The system of claim 5, wherein the entanglement component further entangles a third threshold qubit from the threshold register to the first threshold qubit and the second threshold qubit; and wherein the system further comprises:
a measurement component that determines whether the preference vector is projected onto the portion of the Hilbert space based on a quantum state of the third threshold qubit.

7. The system of claim 6, wherein the portion of the Hilbert space comprises the first phase region and the second phase region.

8. A computer program product for implementing a thresholding scheme for a qubit phase register, the computer program product comprising a computer readable storage medium having program instructions embodied therewith, the program instructions executable by a processor to cause the processor to:
project, by a system operatively coupled to the processor, a preference vector onto a portion of a Hilbert space based on a value of the qubit phase register, wherein the portion of the Hilbert space encodes singular values of a preference matrix that are greater than or equal to a defined threshold.

9. The computer program product of claim 8, wherein the program instructions further cause the processor to:
compute, by the system, a plurality of binarized phase values based on the defined threshold and the preference matrix; and
determine, by the system, a number of threshold qubits comprised within a threshold register based on an amount of significant digits in the plurality of binarized phase values and an amount of qubits comprised within the qubit phase register.

10. The computer program product of claim 9, wherein the program instructions further cause the processor to:
entangle, by the system, a first threshold qubit from the threshold qubits to quantum states of the qubit phase register that correspond to a first phase region of the Hilbert space that is less than a first binarized phase value from the plurality of binarized phase values; and
entangle, by the system, a second threshold qubit from the threshold qubits to quantum states of the qubit phase register that correspond to a second phase region of the Hilbert space that is greater than a second binarized phase value from the plurality of binarized phase values.

11. The computer program product of claim 10, wherein the program instructions further cause the processor to:
entangle, by the system, a third threshold qubit from the threshold qubits to the first threshold qubit and the second threshold qubit; and
determine, by the system, that the preference vector is projected onto the portion of the Hilbert space based on a quantum state of the third threshold qubit.

12. A system, comprising:
a memory that stores computer executable components; and
a processor, operably coupled to the memory, and that executes the computer executable components stored in the memory, wherein the computer executable components comprise:
a quantum recommendation component that implements a quantum recommendation algorithm using a thresholding scheme that projects a preference vector onto a portion of a Hilbert space based on quantum states of a qubit phase register and a defined threshold.

13. The system of claim 12, further comprising:
a binarization component that computes a plurality of binarized phase values from the defined threshold, wherein the plurality of binarized phase values define a plurality of phase regions of the Hilbert space upon which to project the preference vector.

14. The system of claim 13, further comprising:
an entanglement component that entangles a plurality of threshold qubits of a qubit threshold register with the quantum states of the qubit phase register based the plurality of binarized phase values.

15. The system of claim 14, wherein the entanglement component further entangles another threshold qubit of the qubit threshold register with the plurality of threshold qubits, and wherein the system further comprises:
a measurement component that determines whether the preference vector is projected onto the portion of the Hilbert space based on a quantum state of the another threshold qubit.

* * * * *